(12) United States Patent
Tani et al.

(10) Patent No.: US 8,421,215 B2
(45) Date of Patent: Apr. 16, 2013

(54) LAMINATED AND SINTERED CERAMIC CIRCUIT BOARD, AND SEMICONDUCTOR PACKAGE INCLUDING THE CIRCUIT BOARD

(75) Inventors: Makoto Tani, Inazawa (JP); Takami Hirai, Toyota (JP); Shinsuke Yano, Nagoya (JP); Daishi Tanabe, Niwa-gun (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/331,253

(22) Filed: Dec. 20, 2011

(65) Prior Publication Data

US 2013/0049202 A1    Feb. 28, 2013

Related U.S. Application Data

(63) Continuation of application No. PCT/JP2011/069475, filed on Aug. 29, 2011.

(51) Int. Cl.
| | |
|---|---|
| *H01L 23/12* | (2006.01) |
| *H01L 23/053* | (2006.01) |
| *H01L 23/00* | (2006.01) |
| *H01L 23/48* | (2006.01) |
| *H01L 23/52* | (2006.01) |
| *H01L 29/40* | (2006.01) |
| *H05K 1/00* | (2006.01) |

(52) U.S. Cl.
USPC .......... 257/700; 257/701; 257/703; 257/758; 257/762; 257/E23.009; 174/250

(58) Field of Classification Search .................. 257/701, 257/703, 758, 762, E23.009
See application file for complete search history.

(56) References Cited

U.S. PATENT DOCUMENTS

2010/0025081 A1    2/2010    Arai et al.

FOREIGN PATENT DOCUMENTS

| JP | 02-045357 B2 | 10/1990 |
|---|---|---|
| JP | 05-243330 A1 | 9/1993 |
| JP | 2002-204043 A1 | 7/2002 |
| JP | 2005-217051 A1 | 8/2005 |
| JP | 2006-041017 A1 | 2/2006 |
| JP | 2010-034403 A1 | 2/2010 |

OTHER PUBLICATIONS

Written Opinion dated Sep. 20, 2011 (in English).

*Primary Examiner* — Teresa M Arroyo
(74) *Attorney, Agent, or Firm* — Burr & Brown

(57) ABSTRACT

In the laminated and sintered ceramic circuit board according to the present invention, at least a portion of the inplane conductor is fine-lined, such that the shape of the cross-section surface of the fine-lined inplane conductor is trapezoid, and the height (a), the length (c) of the lower base and the length (d) of the upper base of the trapezoidal cross-section surfaces, and the interval (b) between the lower bases of the trapezoidal cross-section surfaces of the inplane conductors adjacent in a plane parallel to the principal surfaces of the board meet a certain relation. This provides a laminated ceramic circuit board with low open failure rate, short-circuit failure rate and high reliability against high temperature and high humidity in a downsized and short-in-height (thin) semiconductor package.

14 Claims, 3 Drawing Sheets

LAMINATED AND SINTERED CERAMIC CIRCUIT BOARD, AND SEMICONDUCTOR PACKAGE INCLUDING THE CIRCUIT BOARD

BACKGROUND OF THE INVENTION

1. Field of the Invention

The present invention relates to a laminated and sintered ceramic circuit board. Specifically, the present invention relates to a laminated and sintered ceramic circuit board having a fine-lined inner layer wiring. Further, the present invention also relates to a semiconductor package including the laminated and sintered ceramic circuit board.

2. Description of the Related Art

Conventionally, semiconductor packages such as so-called flip-chip BGA packages, in which a semiconductor element such as an IC chip and the like is joined on a circuit board by flip-chip mounting or the like and sealed with molding compound such as resin and the like, are commonly used. Resin circuit boards for such semiconductor packages generally consist of multilayer board, in which plural wiring layers and insulation layers are laminated and the wiring layers and through conductor extending through the insulation layers electrically connect electrical terminal(s) disposed on one surface of the board for mounting a semiconductor element or the like and electrical terminal(s) disposed on the other surface of the board for mounting the package on a circuit board such as a mother board (for example, refer to Patent Document 1).

In addition, a package configuration, in which an intermediate circuit board (interposer) with base material such as silicon and ceramic having a coefficient of thermal expansion close to that of a semiconductor element, has been proposed. Such configuration can decrease thermal stress acting between a semiconductor element and an intermediate board in association with temperature alteration. As a result, problems such as breakdown of joining part of a semiconductor element, warpage of an intermediate board due to thermal stress acting on joining part of a semiconductor element can be decreased.

Intermediate circuit boards as described above generally consist of multilayer board, in which insulation layers and wiring layers are laminated, and the wiring layers and through conductor extending through the insulation layers electrically connect electrical terminal(s) disposed on one surface of the board for mounting a semiconductor element or the like and electrical terminal(s) disposed on the other surface of the board for mounting the intermediate board on a package board (resin circuit board) (for example, refer to Patent Documents 2 and 3).

By the way, responding to rising performance and downsizing of electronic devices and the like, the market demand for fast, downsized and short-in-height (thin) circuit element packages for use in various electronic devices (for example, semiconductor packages such as IC packages and the like) has been increasing. As a result, in a circuit element (for example, a semiconductor element such as an IC chip, a resistive element, a capacitative element, an inductor element and the like) constituting a circuit element package, especially in a semiconductor element, demand for fast signal transmission, fine-lined (minute) pitch (interval) between wirings and a thin element continues to increase. Specifically, although the line width and line interval in a wiring layer of a circuit board and intermediate circuit board for a semiconductor package as described above is conventionally required to be around 25 to 150 µm, to respond to the market demand and the increase in number of terminals in a semiconductor element, such as an IC chip, what is needed is circuit boards having more fine-lined line width and line interval of around 5 to 15 µm.

CITATION LIST

Patent Literature

[Patent Document 1] Japanese Patent Application Laid-Open (kokai) No. 05-243330
[Patent Document 2] Japanese Examined Patent Publication (kokoku) No. 02-45357
[Patent Document 3] Japanese Patent Application Laid-Open (kokai) No. 2010-034403

SUMMARY OF THE INVENTION

As mentioned previously, in the art, in association with rising fine-lined wiring pitch (interval) of semiconductor elements, even for a wiring layer of a circuit board and intermediate circuit board for a semiconductor package, having more fine-lined line widths and line intervals of around 5 to 15 µm are necessary. Therefore, the inventors manufactured circuit boards with line widths and line intervals in a wiring layer of 15 µm or less by way of trial, evaluated and reviewed the same, and then problems such as frequent occurrences of open of wiring (disconnection) and decrease in reliability under high temperature and high humidity environment occurred.

The present invention has been conceived to address such problems. Namely, the present invention has an objective to provide a laminated ceramic circuit board with low open failure rate and high reliability against high temperature and high humidity, in spite of its fine-lined wiring layer. Further, the present invention has another objective to provide a fast, downsized and short-in-height (thin) semiconductor package with high reliability by using such a circuit board.

According to a first aspect of the present invention, there is provided a laminated and sintered ceramic circuit boardcomprising:

a base material comprising a plurality of dielectric layers of ceramic, a plurality of first surface electrodes, each electrode comprising a conductor exposed at a first principal surface of the base material that is one of two principal surfaces, a plurality of second surface electrodes, each electrode comprising a conductor exposed at a second principal surface of the base material that is another of the two principal surfaces, and an inner layer wiring comprising a conductor embedded within the base material;

wherein the inner layer wiring electrically connects at least a portion of the first surface electrodes and at least a portion of the second surface electrodes, the inner layer wiring comprises a through conductor extending through at least one of plurality of dielectric layers in a direction perpendicular to the principal surfaces and inplane conductors extending in a plurality of planes parallel to the principal surfaces, at least a portion of the inplane conductors are fine-lined inplane wiring which has a trapezoidal cross-section perpendicular to the extending direction of the portion, where an upper base and a lower base of the trapezoid are parallel to the principal surfaces, a length (c) of the lower base is 15 µm or less, the portion has an adjacent another portion of the inplane conductors in a plane parallel to the principal surfaces, the adjacent another portion has an another trapezoidal cross-section perpendicular to the extending direction of the adjacent another portion, and an interval (b) between the lower bases of the trapezoids of the portion and the adjacent another portion is 15 μm or less, a height (a) of the trapezoidal cross-section of the inplane conductor constituting the fine-lined inplane wiring and the interval (b) meet the relation represented by the following formula (1):

$$0.4 \leq \frac{a}{b}, \quad \frac{a}{b} \leq 0.6 \qquad (1)$$

the height (a), the interval (b), the length (c) of the lower base and the length (d) of the upper base of the trapezoidal cross-section of inplane conductors constituting the fine-lined inplane wiring meet the relation represented by the following formula (2):

$$-\frac{3}{10} \times \frac{a}{b} + 0.75 \leq \frac{d}{c}, \quad \frac{d}{c} \leq -\frac{11}{20} \times \frac{a}{b} + 1.20 \qquad (2)$$

can achieve the above-described objective.

According to a second aspect of the present invention, there is provided, a semiconductor package comprising a semiconductor element and a package board, wherein:

the semiconductor element and the package board are electrically connected through an intermediate board interposed between the semiconductor element and the package board, the intermediate board is a laminated and sintered ceramic circuit board, comprising:

a base material comprising a plurality of dielectric layers of ceramic, a plurality of first surface electrodes, each electrode comprising a conductor exposed at a first principal surface of the base material that is one of two principal surfaces, a plurality of second surface electrodes, each electrode comprising a conductor exposed at a second principal surface of the base material that is another of the two principal surfaces, and an inner layer wiring comprising a conductor embedded within the base material;

wherein the inner layer wiring electrically connects at least a portion of the first surface electrodes and at least a portion of the second surface electrodes, the inner layer wiring comprises a through conductor extending through at least one of the plurality of dielectric layers in a direction perpendicular to the principal surfaces and inplane conductors extending in a plurality of planes parallel to the principal surfaces, at least a portion of the inplane conductors are a fine-lined inplane wiring which has a trapezoidal cross-section perpendicular to the extending direction of the portion, where an upper base and a lower base of the trapezoid are parallel to the principal surfaces, a length (c) of the lower base is 15 μm or less, the portion has an adjacent another portion of the inplane conductors in a plane parallel to the principal surfaces, the adjacent another portion has an another trapezoidal cross-section perpendicular to the extending direction of the adjacent another portion, and an interval (b) between the lower bases of the trapezoids of the portion and the adjacent another portion is 15 μm or less, a height (a) of the trapezoidal cross-section of the inplane conductor constituting the fine-lined inplane wiring and the interval (b) meet the relation represented by the following formula (1):

$$0.4 \leq \frac{a}{b}, \quad \frac{a}{b} \leq 0.6 \qquad (1)$$

the height (a), the interval (b), the length (c) of the lower base and the length (d) of the upper base of the trapezoidal cross-section of inplane conductors constituting the fine-lined inplane wiring meet the relation represented by the following formula (2):

$$-\frac{3}{10} \times \frac{a}{b} + 0.75 \leq \frac{d}{c}, \quad \frac{d}{c} \leq -\frac{11}{20} \times \frac{a}{b} + 1.20 \qquad (2)$$

can achieve the above-described another objective.

As described above, at least a portion of the inplane conductor, which the laminated and sintered ceramic circuit board according to the present invention comprises, is fine-lined, and the width of the inplane conductor in the portion and the interval between the inplane conductor and its adjacent inplane conductor are smaller than predetermined values. Specifically, at least a portion of the inplane conductor, which the laminated and sintered ceramic circuit board according to the present invention, is a fine-lined inplane wiring which has a trapezoidal cross-section perpendicular to the extending direction of the portion, where an upper base and a lower base of the trapezoid are parallel to the principal surfaces, a length (c) of the lower base is 15 μm or less, the portion has an adjacent another portion of the inplane conductors in a plane parallel to the principal surfaces, the adjacent another portion has an another trapezoidal cross-section perpendicular to the extending direction of the adjacent another portion, and an interval (b) between the lower bases of the trapezoids of the portion and the adjacent another portion is 15 μm or less.

In addition, in the laminated and sintered ceramic circuit board according to the present invention, a height (a) of the trapezoidal cross-section of the inplane conductor constituting the fine-lined inplane wiring and the interval (b) between adjacent inplane conductors meet the relation defined by the above-described formula (1). Specifically, the ratio (a/b) of the height (a) to the interval (b) of the inplane conductor constituting the fine-lined inplane wiring is 0.4 or more, and 0.6 or less.

Further, in the laminated and sintered ceramic circuit board according to the present invention, the height (a) and the interval (b) and the length (c) of the lower base and the length (d) of the upper base of the trapezoidal cross-section of inplane conductors constituting the fine-lined inplane wiring meet the relation defined by the above-described formula (2). Specifically, the ratio (d/c) of the length (d) of the upper base to the length (c) of the lower base of the trapezoidal cross-section of inplane conductors constituting the fine-lined inplane wiring is −3/10*(a/b)+0.75 or more, and −11/20*(a/b)+1.20 or less.

In the laminated and sintered ceramic circuit board according to the present invention, at least a portion of the inplane conductor is fine-lined. Nevertheless, as described above, by means of configuring the shape of the cross-section of the fine-lined inplane conductor is trapezoid, and the height (a), the length (c) of the lower base, and the length (d) of the upper base of the trapezoidal cross-section, and the interval (b) between the lower bases of the trapezoidal cross-section of the inplane conductors adjacent in a plane parallel to the principal surfaces of the board, meet a certain relation, problems such as frequent occurrences of open of wiring (disconnection) and decrease in reliability under high temperature and high humidity environment can be suppressed. Namely, the present invention provides a laminated ceramic circuit board with low open failure rate, short-circuit failure rate, and high reliability against high temperature and high humidity, in spite of its fine-lined wiring layer. In addition, the present invention provides a fast, downsized and short-in-height (thin) semiconductor package with high reliability by using such a circuit board.

DETAILED DESCRIPTION OF THE INVENTION

Figure 1:
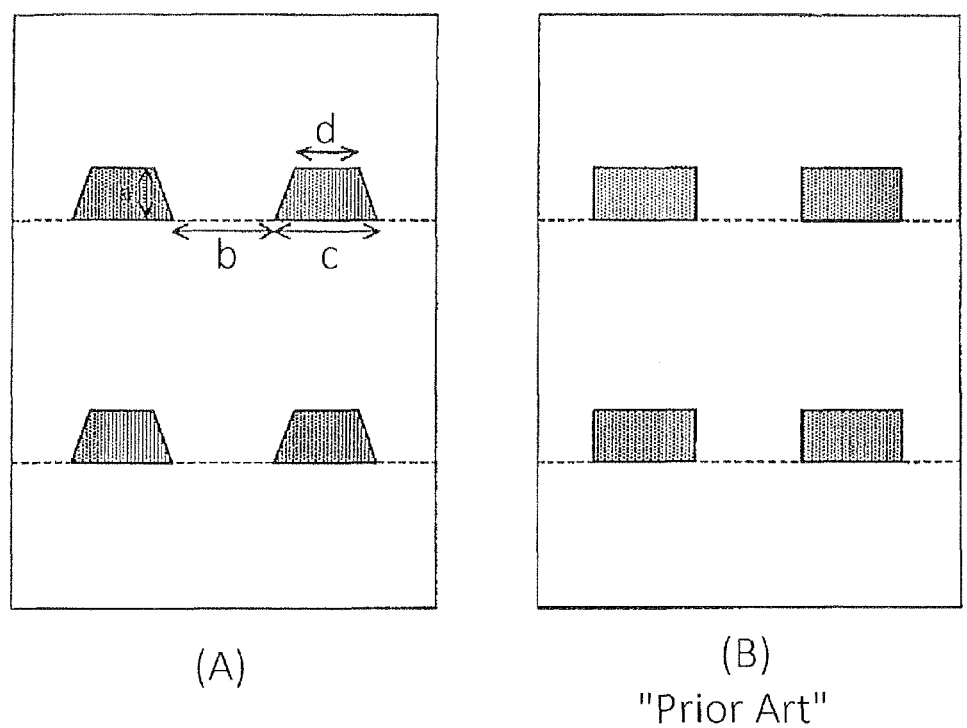
FIG. 1 is a schematic view showing the shape of the cross-section surfaces of an inplane conductor constituting a fine-lined inplane wiring that a laminated and sintered ceramic circuit board according to one embodiment of the present invention comprises, comparing with the shape of the cross-section surfaces of an inplane conductor according to a prior art.

As mentioned previously, the present invention has an objective to provide a laminated ceramic circuit board with low open failure rate and low short-circuit failure rate, and high reliability against high temperature and high humidity, in spite of its fine-lined wiring layer.

The inventors have devoted themselves to investigation in order to achieve the above-described objective and consequently have found that, as mentioned previously, by means of the configuration that the shape of the cross-section of the fine-lined inplane conductor is trapezoid, and that the height (a), the length (c) of the lower base, and the length (d) of the upper base of the trapezoidal cross-section, and the interval (b) of the lower bases of the trapezoidal cross-section of the inplane conductors adjacent in a plane parallel to the principal surfaces of the board, meet a certain relation, problems such as frequent occurrences of open of wiring (disconnection) and decrease in reliability under high temperature and high humidity environment can be suppressed.

Namely, a laminated and sintered ceramic circuit board, comprising:

a base material comprising a plurality of dielectric layers of ceramic, a plurality of first surface electrodes, each electrode comprising a conductor exposed at a first principal surface of the base material that is one surface of two principal surfaces, a plurality of second surface electrodes, each electrode comprising a conductor exposed at a second principal surface of the base material that is another two principal surfaces, and an inner layer wiring comprising conductor embedded within the base material;

wherein the inner layer wiring electrically connects at least a portion of the first surface electrodes and at least a portion of the second surface electrodes, the inner layer wiring comprises a through conductor extending through at least one of the plurality of dielectric layers in a direction perpendicular to the principal surfaces and inplane conductors extending in a plurality of planes parallel to the principal surfaces, at least a portion of the inplane conductors are fine-lined inplane wiring which has a trapezoidal cross-section perpendicular to the extending direction of the portion, where an upper base and a lower base of the trapezoid are parallel to the principal surfaces, a length (c) of the lower base is 15 μm or less, the portion has an adjacent another portion of the inplane conductors in a plane parallel to the principal surfaces, the adjacent another portion has an another trapezoidal cross-section surface perpendicular to the extending direction of the adjacent another portion, and an interval (b) between the lower bases of the trapezoids of the portion and the adjacent another portion is 15 μm or less, a height (a) of the trapezoidal cross-section of the inplane conductor constituting the fine-lined inplane wiring and the interval (b) meet the relation represented by the following formula (1):

$$0.4 \leq \frac{a}{b}, \quad \frac{a}{b} \leq 0.6 \quad (1)$$

the height (a), the interval (b), the length (c) of the lower base and the length (d) of the upper base of the trapezoidal cross-section inplane conductors constituting the fine-lined inplane wiring meet the relation represented by the following formula (2):

$$-\frac{3}{10} \times \frac{a}{b} + 0.75 \leq \frac{d}{c}, \quad \frac{d}{c} \leq -\frac{11}{20} \times \frac{a}{b} + 1.20 \quad (2)$$

is the first embodiment of the present invention.

As described above, the laminated and sintered ceramic circuit board according to the present embodiment comprises a base material comprising a plurality of dielectric layers of ceramic. As mentioned previously, ceramic has a coefficient of thermal expansion close to that of silicon constituting a semiconductor element. Accordingly, in the laminated and sintered ceramic circuit board according to the present embodiment, even when the board in a condition where it is joined with a semiconductor element is exposed to temperature alteration as mentioned previously, the difference between dimension change of the semiconductor element and that of the board is small. As a result, in the laminated and sintered ceramic circuit board according to the present embodiment, thermal stress acting between the semiconductor element and the board can be suppressed.

Thereby, problems such as breakdown of a joining part between a semiconductor element and a board, due to thermal stress acting between the semiconductor element and the board in association with temperature alteration that the semiconductor element and the board suffer from, for example, on soldering the semiconductor element to the board by means of flip-chip bonding or the like, soldering a semiconductor package including the board to a circuit board (for example, mother board) by means of BGA reflow, or the like, are decreased.

In addition, as mentioned previously, ceramic has higher mechanical strength as compared with conventional board materials (for example, resin and the like). Accordingly, in the laminated and sintered ceramic circuit board according to the present embodiment, even when the thickness of the board is decreased for the purpose of making a circuit element package as mentioned previously short-in-height or the like, sufficient rigidity can be maintained. Thereby, problems such as warpage of the board due to thermal stress acting between a semiconductor element and the board in association with temperature alteration that the semiconductor element and the board suffer from are decreased.

As mentioned previously, in the laminated and sintered ceramic circuit board according to the present embodiment a plurality of first surface electrodes, each electrode comprising a conductor exposed at a first principal surface of the base material that is one of two principal surfaces of the board, and a plurality of second surface electrodes, each electrode comprising a conductor exposed at a second principal surface of the base material that is another of the two principal surfaces of the board. In other words, on each of two principal surfaces (i.e., the first principal surface and the second principal surface) of the laminated and sintered ceramic circuit board according to the present embodiment, a plurality of surface electrodes (i.e., respectively the first surface electrodes and the second surface electrodes) are disposed for being joined with a target object (for example, a semiconductor element, a package board or the like), which is joined to each of the principal surfaces, to establish electrical connection.

Specifically, on the first principal surface of the laminated and sintered ceramic circuit board according to the present embodiment, one or more first surface electrodes are disposed so that conductor with size and shape required to be joined and establish electrical connection with a target object (for example, a semiconductor element or the like) to be joined on the first principal surface side at a position corresponding to a terminal or electrode (for example, bump or the like) that the target object comprises for electrical joining. On the other hand, on the second principal surface of the laminated and sintered ceramic circuit board according to the present embodiment, one or more second surface electrodes are disposed so that conductor with size and shape (on which a bump or the like can be disposed) required to be joined and establish electrical connection with a target object (for example, a package board or the like) to be joined on the second principal surface side at a position corresponding to a terminal or electrode (for example, land or the like) that the target object comprises for electrical joining.

As described above, when a plurality of first surface electrodes are disposed on the first principal surface of the laminated and sintered ceramic circuit board according to the present embodiment, the plurality of first surface electrodes are disposed on the first principal surface with a pitch corresponding to that of terminals or electrodes of a target object to be electrically joined on the first principal surface side. Similarly, when a plurality of second surface electrodes are disposed on the second principal surface of the laminated and sintered ceramic circuit board according to the present embodiment, the plurality of second surface electrodes are disposed on the second principal surface with a pitch corresponding to that of terminals or electrodes of a target object to be electrically joined on the second principal surface side.

Although electrical joining of the first surface electrodes and the second surface electrodes which are exposed, respectively on the first principal surface and the second principal surface of the laminated and sintered ceramic circuit board according to the present embodiment with target objects on the respective principal surfaces can be achieved by means of, for example, soldering, the method for electrically connecting them is not limited to a certain technique, and any technique known in the art can be used to achieve the same. As examples of such techniques, besides soldering, for example, intermetallic compound joining such as Cu—Cu3Sn—Cu, diffusion joining such as Cu—Cu, W—W, and the like can be exemplified. Since a laminated and sintered ceramic circuit board has high heat-resistance and rigidity, a terminal joining process requiring high temperature of 300° C. or higher or application of pressure, which cannot be applied to a conventional resin circuit board, can be applied thereto, and the option for terminal joining processes increases.

As mentioned previously, in the laminated and sintered ceramic circuit board according to the present embodiment, an inner layer wiring comprising a conductor is embedded within the base material. In addition, the inner layer wiring electrically connects at least a portion of the first surface electrodes and at least a portion of the second surface electrodes. Further, the inner layer wiring comprises a through conductor (via hole) extending through at least one of the plurality of dielectric layers in a direction perpendicular to the principal surfaces, and inplane conductors extending in a plurality of planes parallel to the principal surfaces.

As mentioned previously, the inner layer wiring electrically connects at least a portion of the first surface electrodes and at least a portion of the second surface electrodes. In other words, some of the first surface electrodes disposed on the first principal surface may be connected with none of the second surface electrodes disposed on the second principal surface. Such a first surface electrode which is not connected with any of the second surface electrodes may be electrically connected with another first surface electrode through an inner layer wiring. Alternatively, such a first surface electrode which is not connected with any of the second surface electrodes may be electrically connected only with conductor of an inner layer wiring which is not connected with any other surface electrodes (for example, when an open stab is formed). In addition, a similar thing is applied to the second surface electrodes disposed on the second principal surface as well. Thus, in the laminated and sintered ceramic circuit board according to the present embodiment, pattern of electrical connection among the first surface electrodes, the second surface electrodes, and the inner layer wiring may be variously configured in accordance with the design and specification of a circuit element package, in which the board is used, and the like.

By the way, as mentioned previously, the laminated and sintered ceramic circuit board according to the present embodiment is configured so that the shape of the cross-section perpendicular to the extending direction of the fine-lined inplane conductor is a trapezoid with an upper base and a lower base parallel to the principal surfaces, and a height (a), a length (c) of the lower base and a length (d) of the upper base of the trapezoidal cross-section, and an interval (b) between the lower bases of the trapezoidal cross-section of the inplane conductors adjacent in a plane parallel to the principal surfaces of the board meet a certain relation. For the portions that the height (a), the length (c) of the lower base and the length (d) of the upper base of the trapezoidal cross-section of an inplane conductor constituting fine-lined inplane wiring of the laminated and sintered ceramic circuit board according to one embodiment of the present invention the interval (b) between the lower bases of the trapezoidal cross-section of the inplane conductors adjacent in a plane parallel to the principal surfaces of the board are shown, for example, in FIG. 1 (A).

As mentioned previously. FIG. 1 is a schematic view comparing the shape of the cross-section of an inplane conductor constituting a fine-lined inplane wiring of the laminated and sintered ceramic circuit board according to one embodiment of the present invention to the shape of the cross-section of an inplane conductor according to a prior art. In FIG. 1, each of the plurality of regions demarcated by horizontally extending broken lines represents one of the plurality of dielectric layers of a ceramic, which forms the laminated and sintered ceramic circuit board according to one embodiment of the present invention.

As shown in FIG. 1, the height (a) of the trapezoidal cross-section of an inplane conductor constituting fine-lined inplane wiring in the laminated and sintered ceramic circuit board according to one embodiment of the present invention is a thickness of the inplane conductor constituting the fine-lined inplane wiring. Accordingly, it can be said that the height (a) of the trapezoidal cross-section of the inplane conductor is a dimension of the inplane conductor in the direction of the thickness of the board (lamination direction of the plurality of dielectric layers).

In addition, the interval (b) between the lower bases of the trapezoidal cross-section of the inplane conductors adjacent in a plane parallel to the principal surfaces of the board is a distance (interval) between two adjacent inplane conductors constituting the fine-lined inplane wiring. The plane parallel to the principal surfaces is a plane perpendicular to the thickness direction of the board, and it is a plane perpendicular to the lamination direction of the plurality of dielectric layers. Namely, the above-described two adjacent inplane conductors are embedded at same position (depth) in the thickness direction of the board. Accordingly, it can be said that the interval (b) between the lower bases is a dimension of base material (dielectric) existing between two adjacent inplane conductors constituting at least a portion of the fine-lined wiring in a plane parallel to the principal surfaces.

Further, the length (c) of the lower base of the trapezoidal cross-section perpendicular to the extending direction (of the inplane conductor) with an upper base and a lower base parallel to the principal surfaces is a gauge (width) of the inplane conductor constituting the fine-lined inplane wiring. The extending direction of the inplane conductor is a longitudinal direction (leading direction) of the inplane conductor constituting the fine-lined inplane wiring, and it can be the to be the direction in which electrical current flows within the inplane conductor. In addition, the plane parallel to the principal surfaces is, similarly to the above, a plane perpendicular to the thickness direction of the board, and it is a plane perpendicular to the lamination direction of the plurality of dielectric layers. Accordingly, it can be said that the length (c) of the lower base is a dimension of cross-section of the inplane conductor constituting the fine-lined wiring in a plane parallel to the principal surfaces.

Similarly to the above, the length (d) of the upper base of the trapezoidal cross-section perpendicular to the extending direction (of the inplane conductor) with an upper base and a lower base parallel to the principal surfaces is a gauge (width) of the inplane conductor constituting fine-lined inplane wiring. The extending direction of the inplane conductor is, similarly to the above, a longitudinal direction (leading direction) of the inplane conductor constituting at least a portion of the fine-lined inplane wiring, which can be said to be the direction in which electrical current flows within the inplane conductor. In addition, the plane parallel to the principal surfaces is, similarly to the above, a plane perpendicular to the thickness direction of the board, and it is a plane perpendicular to the lamination direction of the plurality of dielectric layers. Accordingly, it can be said that the length (d) of the upper base is a dimension of cross-section of the inplane conductor constituting the fine-lined wiring in a plane parallel to the principal surfaces, similarly to the length (c) of the lower base.

As mentioned previously, at least a portion of the inplane conductor of the laminated and sintered ceramic circuit board according to the present embodiment is fine-lined (configured so as to be fine-lined wiring), and the width of the inplane conductor in the portion and the interval between the inplane conductor and its adjacent inplane conductor are smaller than predetermined values. Specifically, at least a portion of the inplane conductor of the laminated and sintered ceramic circuit board according to the present embodiment is fine-lined inplane wiring in which the shape of the cross-section perpendicular to the extending direction (of the inplane conductor) is a trapezoid with its upper base and lower base parallel to the principal surfaces, the length (c) of the lower base of the trapezoid is 15 μm or less, and the interval (b) between the lower bases of the trapezoidal cross-section of inplane conductors adjacent in a plane parallel to the principal surfaces is 15 μm or less.

As mentioned at the beginning, responding to rising performance and downsizing of electronic devices and the like, the market need to fast, downsized and short-in-height (thin) circuit element packages to be used in various electronic devices (for example, semiconductor packages such as IC packages and the like) have been continuing to increase. As a result, in a circuit element (for example, a semiconductor element such as an IC chip, a resistive element, a capacitative element, an inductor element and the like) constituting a circuit element package, especially in a semiconductor element, the demand for fast signal transmission using fine-lined (minute) pitch (interval) between wirings and a thin circuit element continues to increase. Accordingly, a board, to which such a semiconductor element is joined, using fine-lined wiring pitch (interval) is needed.

From such a viewpoint, it is desirable that the pitches of wirings (conductor) constituting the first surface electrodes and the second surface electrodes, as well as the inner layer wiring that the laminated and sintered ceramic circuit board according to the present embodiment are also fine-lined. Specifically, in the laminated and sintered ceramic circuit board according to the present embodiment, as mentioned previously, it is desirable that at least a portion of the inplane conductors are fine-lined inplane wiring in which the shape of the cross-section perpendicular to extending direction (of the inplane conductor) is a trapezoid with its upper base and lower base parallel to the principal surfaces, the length (c) of the lower base of the trapezoid is 15 μm or less, more preferably 10 μm or less, and the interval (b) between the lower bases of the trapezoidal cross-section of inplane conductors adjacent in a plane parallel to the principal surfaces is 15 μm or less, more preferably 10 μm or less.

In addition, in the laminated and sintered ceramic circuit board according to the present embodiment, it is desirable that the height (a) of the trapezoidal cross-section of the inplane conductor constituting the fine-lined inplane wiring and the interval (b) between adjacent inplane conductors meet the relation defined by the above-described formula (1). Specifically, it is desirable that the ratio (a/b) of the height (a) to the interval (b) of the inplane conductors constituting the fine-lined inplane wiring is 0.4 or more, more preferably 0.45 or more, and 0.6 or less, more preferably 0.55 or less.

By the way, when a laminated and sintered ceramic circuit board comprising a highly fine-lined inner layer wiring (fine-lined inplane wiring) as described above is to be obtained, as mentioned previously, there has been a problem that an open failure rate in the inner layer wiring is high or its reliability decreases under high temperature and high humidity environment.

Herein, open failure refers to a problem that continuity cannot be assured in a wiring path in which good continuity should be assured in design (for example, poor continuity, disconnection and the like). Accordingly, an open failure rate refers to an incidence rate of such open failure (for example, poor continuity, disconnection and the like). In addition, a short-circuit failure refers to a problem that insulation cannot be assured between distinct wiring paths in which electrical insulation should be assured in design (becomes conduction state) (for example, poor insulation, short-circuit and the like). Accordingly, a short-circuit failure rate refers to an incidence rate of such short-circuit failure (for example, poor insulation, short-circuit and the like).

Further, the reliability under high temperature and high humidity environment refers to that the insulation resistance between distinct wiring paths in which electrical insulation should be assured in design is maintained at a predetermined value or higher after exposure under an environment at predetermined temperature and humidity for a predetermined period. Specifically, the reliability under high temperature and high humidity environment can be evaluated based on whether the insulation resistance between the above-described terminals, for example, after exposure to an environment with temperature of 85±2° C. and humidity of 80 to 90% for 500 hours is 1 GΩ ($10^9$Ω) or more or not.

Therefore, as a result of devotion of themselves to investigation, the inventors have found that, even in the laminated and sintered ceramic circuit board according to the present embodiment, which comprises a highly fine-lined inner layer wiring (fine-lined inplane wiring) as described above, by adjusting the shape of the cross-section of the inplane conductor constituting the fine-lined inplane wiring and the interval between the inplane conductors so that the ratio (a/b) of the height (a) to the interval (b) of the inplane conductor constituting the fine-lined inplane wiring and the ratio (d/c) of the length (d) of the upper base to the length (c) of the lower base of the trapezoidal cross-section surfaces of inplane conductors constituting the fine-lined inplane wiring meet a predetermined relation, open failure as mentioned above and decrease in reliability under high temperature and high humidity environment (decrease in insulation resistance) can be remarkably decreased.

Specifically, in the laminated and sintered ceramic circuit board according to the present embodiment, it is desirable that the height (a) and the interval (b) and the length (c) of the lower base and the length (d) of the upper base of the trapezoidal cross-section of inplane conductors constituting the fine-lined inplane wiring meet the relation defined by the above-described formula (2). More specifically, it is desirable that the ratio (d/c) of the length (d) of the upper base to the length (c) of the lower base of the trapezoidal cross-section of inplane conductors constituting the fine-lined inplane wiring is $-3/10*(a/b)+0.75$ or more, and $-11/20*(a/b)+1.20$ or less.

When the ratio (d/c) of the length (d) of the upper base to the length (c) of the lower base of the trapezoidal cross-section of inplane conductors constituting the fine-lined inplane wiring is less than $-3/10*(a/b)+0.75$, open failure rate undesirably increases. This is considered that, for example, in the case that so-called "gel cast method" (will be mentioned hereinafter in detail) is adopted as a method for manufacturing a laminated and sintered ceramic circuit board, open failure (poor continuity) occurs since conductor material remains on protective substrate and thereby the thickness of the conductor decreases or the conductor is lost at this portion due to excessively short upper base of the cross-section of conductor pattern when the protective substrate is detached from dielectric sheet (dielectric layer) with conductor pattern to be the inplane conductor embedded therein.

On the other hand, when the ratio (d/C) of the length (d) of the upper base to the length (c) of the lower base of the trapezoidal cross-section of inplane conductors constituting the fine-lined inplane wiring is more than $-11/20*(a/b)+1.20$, the shape of the cross-section of the inplane conductor constituting the fine-lined inplane wiring gets close to rectangle (rectangle or square) from trapezoid. Since open failure rate increases or reliability against high temperature and high humidity decreases, it is not desirable. This is considered that, for example, in the case that so-called "gel cast method" (will be mentioned hereinafter in detail) is adopted as a method for manufacturing a laminated and sintered ceramic circuit board, when dielectric sheet (dielectric layer) with conductor pattern embedded therein, for example, by disposing conductor pattern (inplane conductor) on protective substrate by means of transfer method or the like and then filling slurry of dielectric comprising ceramic into portions where the conductor pattern is not disposed, since it is difficult to fill the slurry into a corner portion formed by the side surfaces of the conductor patterns and the surface of the protective substrate and a void becomes likely to occur at the portion, moisture penetrate into the void on exposure to high temperature and high humidity environment or the like and decreases insulation resistance after exposure to high temperature and high humidity environment (decreases reliability against high temperature and high humidity).

In addition, it is considered that, also in the case that so-called "doctor blade method" is adopted as a method for manufacturing a laminated and sintered ceramic circuit board, when, over conductor pattern (inplane conductor) disposed, for example, by means of transfer method or the like, on protective substrate or green sheet of ceramic material, another green sheet of ceramic material manufactured in the form of tape is laminated, since lift (lamination failure) occurs at a corner portion formed by the side surfaces of the conductor patterns and the surface of protective substrate or the green sheet and a void becomes likely to occur at the portion, moisture penetrate into the void on exposure to high temperature and high humidity environment or the like and decreases insulation resistance after exposure to high temperature and high humidity environment (decreases reliability against high temperature and high humidity).

Although it is known to raise lamination pressure on lamination of green sheets for the purpose of suppressing the lift (lamination failure) of green sheet as described above, when the lamination pressure is excessively raised, for example, it is considered that micro crack occurs in dielectric layer and moisture penetrates through the micro crack on exposure to high temperature and high humidity environment or the like and decreases insulation resistance after exposure to high temperature and high humidity environment, or the conductor pattern is broken and disconnected to generate open failure (poor continuity).

Further, as a method for manufacturing a laminated and sintered ceramic circuit board, or as a method for filling the void resulting from the lift (lamination failure) of green sheet in a method for laminating green sheets of ceramic material as described above, paste of ceramic material can be coated on the conductor pattern (inplane conductor) disposed as mentioned previously, for example, by means of screen printing method or the like (hereinafter, this may be referred to as "adhesive paste coating method"). However, even in the case that such a method is adopted, it is considered that, when the paste of ceramic material is coated, since it is difficult to fill the slurry into a corner portion formed by the side surfaces of the conductor patterns and the surface of the protective substrate (especially, between adjacent conductor patterns) and a void becomes likely to occur at the portion, moisture penetrates into the void on exposure to high temperature and high humidity environment or the like and decreases insulation resistance after exposure to high temperature and high humidity environment (reliability against high temperature and high humidity).

However, the laminated and sintered ceramic circuit board according to the present embodiment is configured so that the ratio (d/c) of the length (d) of the upper base to the length (c) of the lower base of the trapezoidal cross-section surfaces of inplane conductors constituting the fine-lined inplane wiring is $-3/10*(a/b)+0.75$ or more, and $-11/20*(a/b)+1.20$ or less. Thereby, detachment and lack of conductor pattern as mentioned previously, and void at a corner portion formed by the side surfaces of conductor patterns and the surface of protective substrate or green sheet are unlikely to occur. As a result, the laminated and sintered ceramic circuit board according to the present embodiment can remarkably decrease problems such as open failure, decrease in reliability against high temperature and high humidity and the like. In addition, since void and poor joining between ceramic material and inplane conductor decreases as well, mechanical strength (rigidity) of a board after sintering also increases.

As the above, in the laminated and sintered ceramic circuit board according to the present embodiment, by adopting base material that comprises a plurality of dielectric layers of a ceramic having a coefficient of thermal expansion close to that of silicon constituting a semiconductor element, so that even when the board is exposed to temperature alteration as mentioned previously in a condition where a semiconductor element is joined therewith, thermal stress acting between the semiconductor element and the board can be suppressed. In addition, since ceramic has higher mechanical strength as compared with conventional board materials (for example, resin and the like), even when the thickness of the board is decreased for the purpose of making a circuit element package as mentioned previously short-in-height or the like, sufficient rigidity can be maintained.

In addition to the above, in the laminated and sintered ceramic circuit board according to the present embodiment, as mentioned previously, by adjusting the shape of the cross-section of the inplane conductor constituting the fine-lined inplane wiring and the interval between the inplane conductors so that the ratio (a/b) of the height (a) to the interval (b) of the inplane conductor constituting the fine-lined inplane wiring and the ratio (d/c) of the length (d) of the upper base to the length (c) of the lower base of the trapezoidal cross-section surfaces of inplane conductors constituting the fine-lined inplane wiring meet a predetermined relation, open failure as mentioned above and decrease in reliability under high temperature and high humidity environment (decrease in insulation resistance) can be remarkably decreased.

Namely, in accordance with the present embodiment, a circuit board with low incidence rates of poor continuity and poor insulation in an inner layer wiring and high reliability against high temperature and high humidity can be provided. Specifically, in accordance with the present embodiment, a laminated ceramic circuit board with low open failure rate and short-circuit failure rate and with suppressed decrease in insulation resistance in association with long term exposure to high temperature and high humidity, in spite of its fine-lined wiring layer, can be provided that can decrease thermal stress acting between a semiconductor element and a board in association with temperature alteration, and has high mechanical strength (rigidity) as a whole board (including a multilayer wiring layer), and has remarkably low incidence rate of poor continuity and poor insulation in an inner layer wiring can be provided.

In the laminated and sintered ceramic circuit board according to a more preferable embodiment of the present invention, it is desirable that the ratio (d/c) of the length (d) of the upper base to the length (c) of the lower base of the trapezoidal cross-section of inplane conductors constituting the fine-lined inplane wiring is $-1/2*(a/b)+0.93$ or more, and $-1/2*(a/b)+1.10$ or less.

Namely, the laminated and sintered ceramic circuit board according to the first embodiment of the present invention, wherein:

the height (a), the interval (b), the length (c) of the lower base and the length (d) of the upper base of the trapezoidal cross-section of inplane conductors constituting the fine-lined inplane wiring meet the relation represented by the following formula (3):

$$-\frac{1}{2} \times \frac{a}{b} + 0.93 \leq \frac{d}{c}, \quad \frac{d}{c} \leq -\frac{1}{2} \times \frac{a}{b} + 1.10 \qquad (3)$$

is the second embodiment of the present invention.

As described above, the laminated and sintered ceramic circuit board according to the present embodiment is configured so that the ratio (d/c) of the length (d) of the upper base to the length (c) of the lower base of the trapezoidal cross-section surfaces of inplane conductors constituting the fine-lined inplane wiring is $-1/2*(a/b)+0.93$ or more, and $-1/2*(a/b)+1.10$ or less. Thereby, detachment and lack of conductor pattern as mentioned previously, and void at a corner portion formed by the side surfaces of conductor patterns and the surface of protective substrate or green sheet become more unlikely to occur. As a result, the laminated and sintered ceramic circuit board according to the present embodiment can further decrease problems such as open failure, decrease in reliability against high temperature and high humidity and the like.

By the way, a method for manufacturing the laminated and sintered ceramic circuit boards according to the previously mentioned various embodiments may be any method as long as a laminated and sintered ceramic circuit board manufactured by the method meets the previously mentioned requirements, and can be properly selected from various methods used for manufacturing a ceramic circuit board in the art. As specific examples of methods for manufacturing the laminated and sintered ceramic circuit boards according to the previously mentioned various embodiments, for example, so-called "gel cast method", "doctor blade method" and the like can be exemplified.

When the gel cast method is adopted, for example, by disposing conductor pattern on the surface of film-like or thin plate-like protective substrate, by means of printing method such as screen printing method or the like or transfer method such as film transfer method or the like, filling slurry of dielectric comprising ceramic into portions where the conductor pattern is not disposed, hardening the slurry and thereafter detaching the protective substrate to manufacture a dielectric sheet (dielectric layer) with the conductor pattern embedded therein, laminating the necessary number of thus manufactured dielectric sheets (dielectric layers) so as to configure the conductor patterns as surface electrodes and inner layer wirings, and sintering the same, the laminated and sintered ceramic circuit boards according to the previously mentioned various embodiments can be obtained.

As the above-described protective substrate, polyethylene terephthalate (PET) film, polyethylene naphthalate (PEN) film and the like are desirably used and, besides resin film, various film-like and plate-like materials such as glass, paper, metal and the like can be used. However, as protective substrate, from the viewpoint of easy detachment handling, a flexible one is preferably used.

In addition, for example, for the purpose of easy detachment of the above-described dielectric sheet from the protective substrate, for example, a release agent or the like may be coated on the surface of the above-described protective substrate. Such release agents include, for example, various chemicals known as release agent in the art. More specifically, as such release agent, a well-known silicone series release agent, fluorine series release agent and the like can be used.

The above-described conductor pattern is desirably disposed by forming conductor paste comprising, as major components, at least one or more kinds of metal elected from, for example, gold, silver, copper and the like and a thermosetting resin precursor, on the surface of the above-described protective substrate, by means of printing method such as screen printing method or the like or transfer method such as film transfer method or the like. As such thermosetting resin precursor, phenol resin, resole resin, urethane resin, epoxy resin, melamine resin and the like can be used. Among these, phenol resin and resole resin are especially preferred. By disposing such conductor paste on the surface of the above-described protective substrate and thereafter hardening binder contained in the conductor paste, the conductor pattern can be obtained.

As the slurry of the dielectric, for example, a slurry comprising resin, ceramic powder and solvent can be exemplified. Herein, resin functions as so-called "binder", and thermosetting resin such as phenol resin, resole resin or polyurethane resin, or polyurethane precursor comprising polyol and polyisocyanate and the like can be used. Among these, thermosetting resin precursor comprising polyol and polyisocyanate is especially preferable.

As ceramic material used as ceramic powder, either oxide series ceramic or non-oxide series ceramic may be used. For example, alumina ($Al_2O_3$), zirconia ($ZrO_2$), barium titanate ($BaTiO_3$), aluminum nitride (AlN), silicon nitride ($Si_3N_4$), silicon carbide (SIC), composite material obtained by sintering silicon carbide together with silicon (Si—SiC), barium oxide (BaO), titanium oxide ($TiO_2$), silicon oxide ($SiO_2$), zinc oxide ($ZnO_2$), neodymium oxide ($Nd_2O_3$) and the like can be used. In addition, only one kind of these materials by itself or in a combination of two or more kinds of them may be used. Further, as long as the slurry can be prepared, grain size of the ceramic material is not particularly limited.

The laminated and sintered ceramic circuit boards according to the previously mentioned various embodiments comprises a highly fine-lined inner layer wiring (fine-lined inplane wiring) as described above. Accordingly, when the grain size of the ceramic material is too large, it may lead to problems such as disconnection of conductor pattern and the like. From such viewpoint, it is desirable that the grain size of ceramic material is smaller than a certain value. For example, in the laminated and sintered ceramic circuit boards according to the previously mentioned various embodiments, the average grain size of ceramic material used as ceramic powder is desirably less than 1.8 μm when the length (c) of the lower base of the fine-lined inplane wiring's trapezoidal cross-section perpendicular to its extending direction is 15 μm or less, and it is desirably less than 1.5 μm when the length (c) of the lower base is 10 μm or less.

In addition, the above-described solvent is not particularly limited as long as it can solve the above-described resin as binder (and dispersant, if any). As specific examples of the solvent, a solvent having two or more ester bonds, such as polybasic acid ester (for example, dimethyl glutarate and the like), ester of polyalcohol (for example, triacetin (glyceryl triacetate) and the like) and the like can be exemplified.

Further, the above-described dielectric slurry may contain dispersant besides the above-mentioned resin, ceramic powder and solvent. As specific examples of dispersant, for example, polycarboxylic acid series copolymer, polycarboxylate and the like can be exemplified. By adding such dispersant, the viscosity of the slurry before being formed can be decreased and its fluidity can be increased.

By the way, as mentioned previously, as methods for manufacturing the laminated and sintered ceramic circuit boards according to the previously mentioned various embodiments, for example, gel cast method, doctor blade method and adhesive paste coating method can be exemplified. When any of these methods is adopted, in order to decrease problems such as open failure and decrease in reliability against high temperature and high humidity, it is important to suppress the occurrence of a void at a corner portion (root portion of conductor pattern) formed by the side surfaces of conductor patterns and the surface of protective substrate or green sheet (especially, between adjacent conductor patterns) as mentioned previously.

In order to suppress the occurrence of a void at the above-described corner portion, it is desirable that the space formed by the side surfaces facing to each other of the adjacent conduct patterns and the surface of the protective substrate or the green sheet, on which the conductor patterns are disposed, has a shape with its opening larger than its bottom. In order for the space to present such a shape, it is desirable that the cross-section of the conductor pattern has a trapezoidal shape with a lower base which is the side contacting the surface of the protective substrate or the green sheet, on which the conductor patterns are disposed. In other words, it is desirable that the lower base of the trapezoidal cross-section of the inplane conductor constituting the fine-lined wiring is disposed in a plane corresponding to a boundary face between a dielectric layer with the inplane conductor embedded therein and a dielectric layer adjacent to the dielectric layer in a direction perpendicular to the principal surfaces.

Accordingly, the third embodiment of the present invention is:

the laminated and sintered ceramic circuit board according to one of the first or second embodiments of the present invention, wherein:

the lower base of the trapezoidal cross-section of inplane conductors constituting the fine-lined inplane wiring exists in a plane corresponding to a boundary face between a dielectric layer constituting the base material with the inplane conductors embedded therein and a dielectric layer adjacent to the dielectric layer in a direction perpendicular to the principal surfaces.

As described above, in the laminated and sintered ceramic circuit board according to the present embodiment, since the lower base of the trapezoidal cross-section of inplane conductors constituting the fine-lined inplane wiring is disposed in a plane corresponding to a boundary face between a dielectric layer constituting the base material with the inplane conductors embedded therein and a dielectric layer adjacent to the dielectric layer in a direction perpendicular to the principal surfaces, the space formed by the side surfaces facing to each other of the adjacent conduct patterns and the surface of the protective substrate or the green sheet, on which the conductor patterns are disposed, presents a shape with its opening larger than its bottom. Thereby, it becomes easier to fill ceramic material into the space, and the occurrence of a void at a corner portion (root portion of conductor pattern) formed by the side surfaces of conductor patterns and the surface of protective substrate or green sheet is suppressed, and problems such as open failure and decrease in reliability against high temperature and high humidity are decreased. In addition, since voids and poor joining between the ceramic material and inplane conductor decreases as well, mechanical strength (rigidity) of a board after sintering also increases.

By the way, the laminated and sintered ceramic circuit board according to the above-described embodiment comprises a highly fine-lined inner layer wiring (fine-lined inplane wiring) as mentioned above. Accordingly, for example, from the viewpoint of decreasing the resistive loss in a semiconductor package using the board, it is desirable to make the electrical resistance of conductor constituting the first surface electrodes and second surface electrodes, and the inner layer wiring as small as possible to lower the wiring resistance. Accordingly, as a major component of the above-mentioned conductor pattern, gold, silver, copper, which are low-resistance conductors, alloys thereof, and the like, are desirable to be used.

Namely, the fourth embodiment of the present invention is:
the laminated and sintered ceramic circuit board according to the first embodiment of the present invention, wherein:
the conductor comprises at least one metal selected from gold, silver and copper.

In the laminated and sintered ceramic circuit board according to the present embodiment, as described above, the conductor constituting the first surface electrodes and second surface electrodes, and the inner layer wiring comprises at least one metal selected from gold, silver and copper. Thereby, even though the laminated and sintered ceramic circuit board according to the present embodiment comprises a highly fine-lined inner layer wiring (fine-lined inplane wiring) with the length (c) of the lower base of the fine-lined inplane wiring's trapezoidal cross-section perpendicular to its extending direction of 15 μm or less, its wiring resistance can be suppressed and the resistive loss in a semiconductor package using the board can be decreased.

By the way, low-resistance conductors such as gold, silver, copper, and alloy comprising some of these metals or the like used for the purpose of decreasing the wiring resistance as described above have relatively low melting point as compared with other metals. When dielectric sheet (dielectric layer) with conductor pattern comprising metal with such low melting point embedded therein is sintered at temperature of the melting point of the metal or more, the metal may melt and make it difficult to maintain desired shape of conductor pattern. Accordingly, when such a low-resistance conductor is used in conductor constituting the first surface electrodes, the second surface electrodes, and the inner layer wiring, it is desirable to use ceramic that can be sintered at a temperature less than the melting point of the low-resistance conductor used therein.

As ceramic that can be sintered at temperature less than the melting point of the low-resistance conductor used therein as described above, it is desirable to use so-called "Low Temperature Co-fired Ceramics (LTCC)". By using LTCC, gold, silver, copper, which are low-resistance conductors, and alloys comprising some of these metals, and the like can be used as the conductor. Thereby, even in the laminated and sintered ceramic circuit board comprising a highly fine-lined inner layer wiring (fine-lined inplane wiring) with the length (c) of the lower base of the fine-lined inplane wiring's trapezoidal cross-section perpendicular to its extending direction of 15 μm or less, its wiring resistance can be suppressed and the resistive loss in a semiconductor package using the board can be decreased and, in addition, the problem that when dielectric sheet (dielectric layer) with conductor pattern comprising metal with such low melting point embedded therein is sintered, the metal may melt and make it difficult to maintain desired shape of conductor pattern can be avoided.

Specifically, the fifth embodiment of the present invention is:
the laminated and sintered ceramic circuit board according to the fourth embodiment of the present invention, wherein:
the conductor comprises copper,
the ceramic is sinterable at a temperature of less than 1080° C.

In addition, the sixth embodiment of the present invention is:
the laminated and sintered ceramic circuit board according to the fourth embodiment of the present invention, wherein:
the conductor comprises silver,
the ceramic is sinterable at a temperature of less than 960° C.

As mentioned above, as ceramic constituting the base material of the laminated and sintered ceramic circuit board according to the above-described two embodiments, for example, LTCC can be exemplified. As such LTCC, for example, material made from mixture of glass powder with inorganic powder such as alumina, aluminum nitride, silicon nitride, silica, mullite and the like, and inorganic composition comprising as a major component, for example, BaO, $Al_2O_3$ and $SiO_2$, or the like can be exemplified.

As specific examples of material made from mixture of glass powder and inorganic powder, for example, borosilicate series glass with a major component of $B_2O_3$—$SiO_2$, and glass containing, in the borosilicate series glass, for example, alkaline-earth metal oxide such as CaO, MgO or the like as a major component and ZnO, $ZrO_2$ or the like as an accessory component, or $SiO_2$ and alkaline metal oxide as a major component and, similarly to the above, ZnO, $ZrO_2$ or the like as an accessory component can be used. As the above-described glass, for example, crystallized glass such as diopside-composition series, cordierite-composition series, spodumene-composition series or the like may be used. In addition, since high strength can be obtained by means of crystallization, crystallized glass power may be used by itself.

As mentioned above, in the laminated and sintered ceramic circuit board according to the above-described two embodiments, a low-resistance conductor is used for the conductor constituting the first surface electrodes, the second surface electrodes, and the inner layer wiring, is a ceramic that can be sintered at a temperature less than the melting point of the low resistance conductor is used. Thereby, even though the laminated and sintered ceramic circuit board according to these embodiments comprises a highly fine-lined inner layer wiring (fine-lined inplane wiring) with the length (c) of the lower base of the fine-lined inplane wiring's trapezoidal cross-section perpendicular to its extending direction of 15 μm or less, its wiring resistance can be suppressed and the resistive loss in a semiconductor package using the board can be decreased.

Further, in the laminated and sintered ceramic circuit board according to these embodiments, since the ceramic constituting the base material of the board can be sintered at a temperature less than the melting point of the low-resistance conductor, the problem that when the base material of a plurality of ceramic dielectric layers is sintered, the metal may melt and make it difficult to maintain the desired shape of the conductor pattern can be avoided.

By the way, as mentioned previously, the present invention has another objective, which is to provide a fast, downsized and short-in-height (thin) semiconductor package with high reliability by using a circuit board that can decrease thermal stress acting between a semiconductor element and the board in association with temperature alteration and has high mechanical strength (rigidity) as a whole board (including a multilayer wiring layer).

The above-described another objective can be achieved by a semiconductor package wherein a semiconductor element and a package board are electrically connected through the laminated and sintered ceramic circuit board according to some embodiments of the present invention as mentioned previously and other embodiments. Now, some embodiments as a semiconductor package using as an intermediate board the laminated and sintered ceramic circuit board according to some embodiments of the present invention as mentioned previously will be listed below. However, since description about the laminated and sintered ceramic circuit board according to some embodiments of the present invention as mentioned previously has been already mentioned hereinbefore, such description about the laminated and sintered ceramic circuit board according to some embodiments of the present invention as mentioned previously may be omitted in the following description about embodiments as a semiconductor package.

Namely, a semiconductor package comprising a semiconductor element and a package board, wherein:

the semiconductor element and the package board are electrically connected through an intermediate board interposed between the semiconductor element and the package board, the intermediate board is a laminated and sintered ceramic circuit board, comprising:

a base material comprising a plurality of dielectric layers of a ceramic, a plurality of first surface electrodes comprising a conductor exposed at a first principal surface of the base material that is one of two principal surfaces, a plurality of second surface electrodes comprising a conductor exposed at a second principal surface of the base material that is another of two principal surfaces, and an inner layer wiring comprising a conductor embedded within the base material;

wherein the inner layer wiring electrically connects at least a portion of the first surface electrodes and at least a portion of the second surface electrodes, the inner layer wiring comprises a through conductor extending through at least one of the plurality of dielectric layers in a direction perpendicular to the principal surfaces and inplane conductors extending in a plurality of planes parallel to the principal surfaces, at least a portion of the inplane conductors are fine-lined inplane wiring which has a trapezoidal cross-section perpendicular to the extending direction of the portion, where an upper base and a lower base of the trapezoid are parallel to the principal surfaces, a length (c) of the lower base is 15 μm or less, the portion has an adjacent another portion of the inplane conductors in a plane parallel to the principal surfaces, the adjacent another portion has an another trapezoidal cross-section perpendicular to the extending direction of the adjacent another portion, and the interval (b) between the lower bases of the trapezoids of the portion and the adjacent another portion is 15 μm or less, the height (a) of the trapezoidal cross-section of the inplane conductor constituting the fine-lined inplane wiring and the interval (b) meet the relation represented by the following formula (1):

$$0.4 \leq \frac{a}{b}, \quad \frac{a}{b} \leq 0.6 \quad (1)$$

the height (a), the interval (b), the length (c) of the lower base and the length (d) of the upper base of the trapezoidal cross-section of inplane conductors constituting the fine-lined inplane wiring meet the relation represented by the following formula (2):

$$-\frac{3}{10} \times \frac{a}{b} + 0.75 \leq \frac{d}{c}, \quad \frac{d}{c} \leq -\frac{11}{20} \times \frac{a}{b} + 1.20 \quad (2)$$

is the seventh embodiment of the present invention.

In addition, as a more preferable embodiment, the semiconductor package according to the seventh embodiment of the present invention, wherein:

the height (a), the interval (b), the length (c) of the lower base and the length (d) of the upper base of the trapezoidal cross-section of inplane conductors constituting the fine-lined inplane wiring meet the relation represented by the following formula (3):

$$-\frac{1}{2} \times \frac{a}{b} + 0.93 \leq \frac{d}{c}, \quad \frac{d}{c} \leq -\frac{1}{2} \times \frac{a}{b} + 1.10 \quad (3)$$

is the eighth embodiment of the present invention.

Further, the ninth embodiment of the present invention is:

the semiconductor package according to one of the seventh or eighth embodiments of the present invention, wherein:

the lower base of the trapezoidal cross-section of inplane conductors constituting the fine-lined inplane wiring are disposed in a plane corresponding to a boundary face between a dielectric layer constituting the base material with the inplane conductors embedded therein and a dielectric layer adjacent to the dielectric layer in a direction perpendicular to the principal surfaces.

The semiconductor element included in the semiconductor package according to the present embodiment is not particularly limited and, as specific examples, for example, integrated circuits (IC), large-scale integrated circuits (LSI) and the like can be exemplified. Herein, semiconductor chips such as integrated circuits (IC), large-scale integrated circuits (LSI) and the like are collectively referred to as "semiconductor IC chips".

As mentioned at the beginning, responding to rising performance and downsizing of electronic devices and the like, in such semiconductor IC chips, demand for fast signal transmission, fine-lined pitch (interval) between wirings and a thin element goes on increasing. Accordingly, it is extremely desirable that, as an intermediate board in a semiconductor package including such a semiconductor IC chip, the laminated and sintered ceramic circuit board according to the present invention is used.

Accordingly, the tenth embodiment of the present invention is:

the semiconductor package according to one of the seventh to ninth embodiments of the present invention, wherein:

the semiconductor element is a semiconductor IC chip.

In addition, as base material for a package board, a resin such as a glass epoxy is generally used.

Accordingly, the eleventh embodiment of the present invention is:

the semiconductor package according to one of the seventh to tenth embodiments, wherein:

base material of the package board comprises a resin.

Further, in the semiconductor package using as an intermediate board the laminated and sintered ceramic circuit board according to the above-described embodiment, the intermediate board comprises a highly fine-lined inner layer wiring (fine-lined inplane wiring) as mentioned above. Accordingly, for example, from the viewpoint of decreasing the resistive loss in a semiconductor package using the intermediate board, it is desirable to make the electrical resistance of conductor constituting the first surface electrodes, the second surface electrodes, and the inner layer wiring as small as possible to lower the wiring resistance. Accordingly, a major component of the above-mentioned conductor pattern is one of gold, silver, copper, which are low-resistance conductors, alloys thereof and the like are desirable to be used.

Accordingly, the twelfth embodiment of the present invention is:

the semiconductor package according to one of the seventh to eleventh embodiments of the present invention, wherein:

the conductor comprises at least one metal selected from gold, silver and copper.

By the way, low-resistance conductors such as gold, silver, copper, and alloys comprising some of these metals or the like used for the purpose of decreasing the wiring resistance as described above have relatively low melting point as compared with other metals. When dielectric sheet (dielectric layer) with conductor pattern comprising metal with such low melting point embedded therein is sintered at temperature of the melting point of the metal or more, the metal may melt and make it difficult to maintain desired shape of conductor pattern. Accordingly, when such a low-resistance conductor is used in conductor constituting the first surface electrodes, second surface electrodes, and the inner layer wiring, it is desirable to use a ceramic that can be sintered at temperature less than the melting point of the low-resistance conductor used therein.

As ceramic that can be sintered at temperature less than the melting point of the low-resistance conductor used therein as described above, it is desirable to use LTCC. By using LTCC, gold, silver, copper, which are low-resistance conductors, alloy comprising some of these metals, and the like can be used as the conductor. Thereby, even in the laminated and sintered ceramic circuit board comprising a highly fine-lined inner layer wiring (fine-lined inplane wiring) with the length (c) of the lower base of the fine-lined inplane wiring's trapezoidal cross-section perpendicular to its extending direction of 15 μm or less, its wiring resistance can be suppressed and the resistive loss in a semiconductor package using the board can be decreased and, in addition, the problem that when dielectric sheet (dielectric layer) with conductor pattern comprising metal with such low melting point embedded therein is sintered, the metal may melt and make it difficult to maintain desired shape of conductor pattern can be avoided.

Specifically, the thirteenth embodiment of the present invention is:

the semiconductor package according to the twelfth embodiment of the present invention, wherein:

the conductor comprises copper, the ceramic is sinterable at a temperature of less than 1080° C.

In addition, the fourteenth embodiment of the present invention is:

the semiconductor package according to the twelfth embodiment of the present invention, wherein:

the conductor comprises silver, the ceramic is sinterable at a temperature of less than 960° C.

As mentioned above, in the semiconductor package according to the above-described two embodiments, low-resistance conductor is selected as conductor constituting the first surface electrodes and second surface electrodes, and the inner layer wiring, and ceramic that can be sintered at temperature less than the melting point of the low resistance conductor is used. Thereby, even though, in the semiconductor package according to these embodiments, the laminated and sintered ceramic circuit board used as an intermediate board comprises a highly fine-lined inner layer wiring (fine-lined inplane wiring) with the length (c) of the lower base of the fine-lined inplane wiring's trapezoidal cross-section perpendicular to its extending direction of 15 μm or less, its wiring resistance can be suppressed and the resistive loss in a semiconductor package using the board can be decreased.

Further, in the semiconductor package according to these embodiments, since ceramic constituting the base material of the laminated and sintered ceramic circuit board is sinterable at a temperature less than the melting point of the low-resistance conductor, the problem that when the base material comprising dielectric layers of the ceramic is sintered, the metal may melt and make it difficult to maintain desired shape of conductor pattern can be avoided.

Referring to the drawings attached hereto, configuration and characteristics of the laminated and sintered ceramic circuit board according to some embodiments of the present invention will be described below. However, the description that will be mentioned below is intended only for exemplification, it should not be construed that the scope of the present invention is limited to the following description.

EXAMPLE (1) Preparation of Sample Boards for Evaluation

FIG. 2 is a schematic view, schematically showing the configuration of a sample board for investigating the relation between incidence rates of open or short-circuit failure and the configuration of the fine-lined inplane wiring in a laminated and sintered ceramic circuit board according to some embodiments of the present invention; and As mentioned previously, FIG. 2 is a schematic view, schematically showing the configuration of a sample board for investigating the relation between incidence rates of open or short-circuit failure and the configuration of the fine-lined inplane wiring in a laminated and sintered ceramic circuit board according to some embodiments of the present invention. The sample boards for evaluation according to the present experimental example were prepared by means of the previously mentioned gel cast method.

Figure 2:
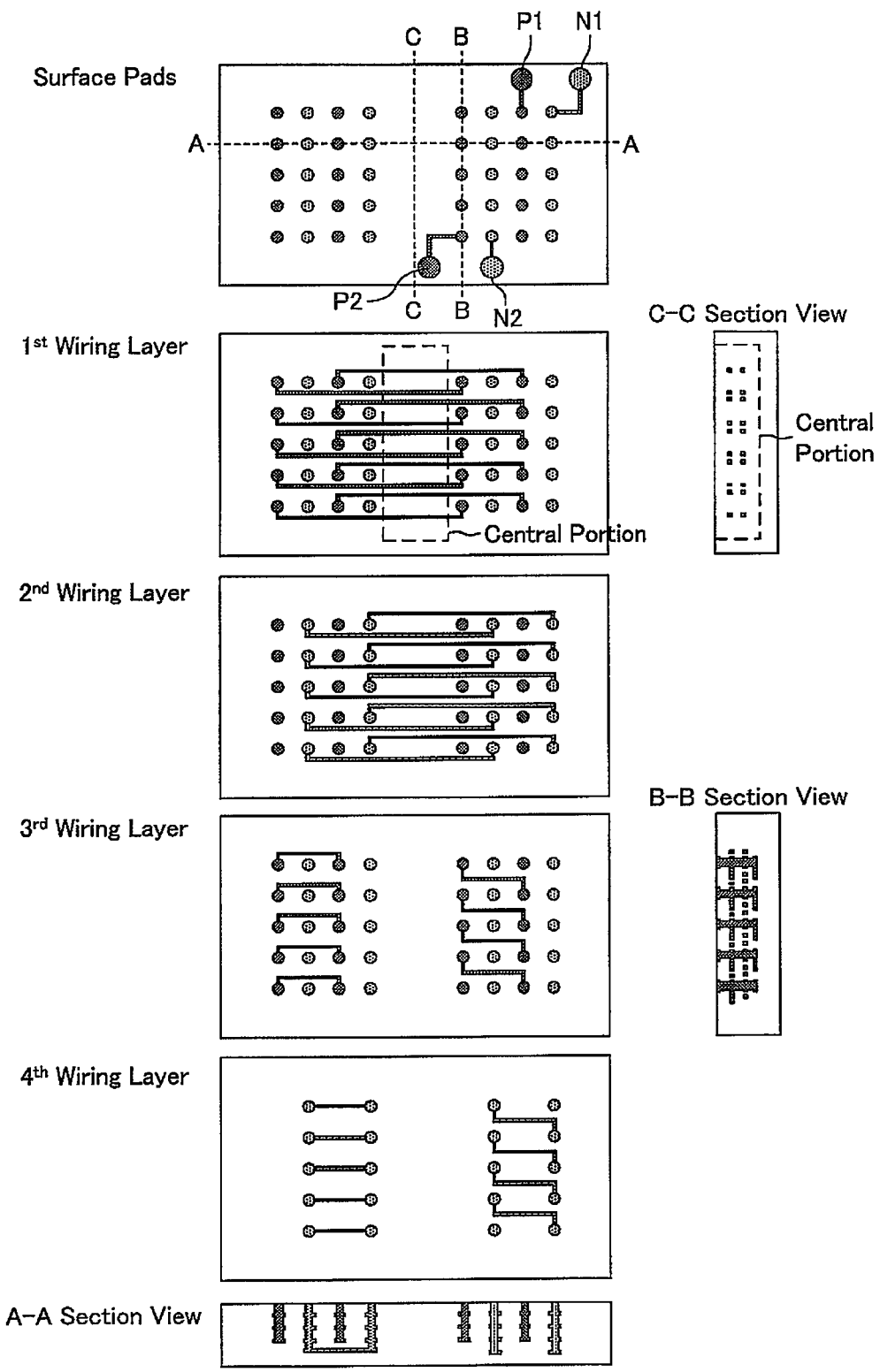
FIG. 2 is a schematic view, schematically showing the configuration of a sample board for investigating the relation between incidence rates of open or short-circuit failure and the configuration of the fine-lined inplane wiring in a laminated and sintered ceramic circuit board according to some embodiments of the present invention.

As shown in FIG. 2, the above-described sample boards for evaluation have surface pads (surface electrodes) disposed on one principal surface and four layers of wiring layers (inner layer wiring) disposed within the board. Namely, each of the sample boards for evaluation has a configuration where the surface pads, the first wiring layer, the second wiring layer, the third wiring layer, and the fourth wiring layer are laminated in this order from the top.

Although FIG. 2 depicts eight columns and five rows of via holes (through conductors) and wiring (inplane conductor) that connects some of the via holes with each other, in fact, 10 rows are disposed by repeating a similar pattern. Namely, in the actual sample boards for evaluation, eighty via holes are disposed. Accordingly, in the actual sample boards for evaluation, the terminals P1 and P2 are wire-connected by the inner layer wiring including forty via holes and similarly the terminals N1 and N2 are wire-connected by the inner layer wiring including forty via holes.

The C-C section view shown adjacent to the plan view of the first wiring layer in FIG. 2 is a section view by a plane including the broken line C-C shown in the plan view of the surface pads in FIG. 2 and perpendicular to the principal surfaces of the sample board for evaluation. As shown in the C-C section view, in the inner layer wirings (the first wiring layer and the second wiring layer) in the central portion of the sample board for evaluation (portion surrounded by the broken line of the plan view of the first wiring layer in FIG. 2), the inplane conductors are disposed close to each other in a plane of each of the wiring layers.

As described above, in the central portion of the sample boards for evaluation, inplane conductors adjacent in a plane of each of the first wiring layer and the second wiring layer are disposed. Accordingly, it can be said that the central portion of the sample boards for evaluation is a region including inplane conductors corresponding to the previously mentioned fine-lined inplane wiring. Namely, the shape of cross-section perpendicular to the extending direction of the inplane conductors included in the region is trapezoid with its upper base and lower base parallel to the principal surfaces. In addition, as shown in FIG. 1, the height, length of lower base and length of upper base of the trapezoid, and the interval between the lower bases of the cross-section of the inplane conductors adjacent in a same wiring layer are represented as a, c, d, and b respectively.

In addition, the B-B section view shown adjacent to the plan view of the third wiring layer in FIG. 2 is a section view by a plane including the broken line B-B shown in the plan view of the surface pads in FIG. 2 and perpendicular to the principal surfaces of the sample board for evaluation. The broken line B-B is a straight line along the fourth column of via holes from the column of via holes located at the observers' right side end in FIG. 2. As shown in FIG. 2, although five via holes as though conductors extending through the first wiring layer, the second wiring layer, and the third wiring layer are disposed in the B-B section view of the sample board for evaluation, as mentioned above, in the actual sample boards for evaluation, ten of the via holes are disposed.

Further, the A-A section view shown adjacent to the plan view of the fourth wiring layer in FIG. 2 is a section view by a plane including the broken line A-A shown in the plan view of the surface pads in FIG. 2 and perpendicular to the principal surfaces of the sample board for evaluation. The broken line A-A is a straight line along the second row of via holes from the row of via holes located at the observers' top side end in FIG. 2. As shown in FIG. 2, in the A-A section view of the sample board for evaluation, four via holes as though conductors extending through the first to third wiring layers and four via holes as though conductors extending through the first to fourth wiring layers are respectively disposed.

When wirings as designed are successfully formed, continuity between the terminals P1 and P2 and continuity between the terminals N1 and N2 should be respectively assured, while insulation between the terminals P1 and N1 and insulation between the terminals P2 and N2 should be respectively assured. Therefore, in the present experimental example, as shown in the following Table 1, various ceramics were adopted as base materials of the sample boards for evaluation and, in each of the base materials, silver (Ag) and copper (Cu) are adopted as conductors contained in wiring. In addition, in these various combinations of base materials and conductors, the above-mentioned open failure rates and short-circuit failure rates were evaluated with the height (a), length (c) of lower base and length (d) of upper base of the trapezoidal cross-section perpendicular to the extending direction of the inplane conductors disposed in the central portion of the sample boards for evaluation, and the interval (b) between the lower bases of the trapezoidal cross-section surfaces of the inplane conductors adjacent in a plane parallel to the principal surfaces of the boards changed variously.

TABLE 1

|  | Ceramic (LTCC) | Conductor | Sintering Temperature | Sintering Atmosphere |
| --- | --- | --- | --- | --- |
| Exp. 1 | BaO—Al$_2$O$_3$—SiO$_2$ series inorganic powder | Ag | 910° C. | Air |
| Exp. 2 | B$_2$O$_3$—SiO$_2$ series borosilicate glass powder + alumina powder | Cu | " | N$_2$/water vapor |
| Exp. 3 | CaO—Al$_2$O$_3$—B$_2$O$_3$—SiO$_2$ series glass powder + alumina powder | Ag | " | Air |

(2) Open Failure Rates and Short-Circuit Failure Rates of Sample Boards for Evaluation In the measurement of the open failure rates of the sample boards for evaluation, for each piece of the sample boards for evaluation, a continuity condition between the terminals P1 and P2 and a continuity condition between the terminals N1 and N2 were examined. When any of the continuity conditions was poor, it was judged as open failure. In addition, in the measurement of the short-circuit failure rates of the sample boards for evaluation, for each piece of the sample boards for evaluation, an insulation condition between the terminals P1 and N1 and an insulation condition between the terminals P2 and N2 were examined. When any of the insulation conditions was poor, it was judged as short-circuit failure. The examination on the continuity condition and insulation condition can be performed, for example, by applying predetermined voltage between the terminals as test object and checking whether electrical current is detected or not between the terminals.

In the evaluation of the open failure rates and the short-circuit failure rates, for each of the combinations of the base materials and conductors shown in Table 1 (Exp. 1 to Exp. 3), one hundred pieces of sample boards for evaluation were prepared with respective to every distinct combination of the height (a), length (c) of lower base and length (d) of upper base of the trapezoidal cross-section perpendicular to the extending direction of the inplane conductors, and the interval (b) between the lower bases of the trapezoidal cross-section of the adjacent inplane conductors. On these sample boards for evaluation, continuity condition and insulation condition were examined, and the proportions of the number of sample boards for evaluation in which the open failure and the short-circuit failure occurred to the total number of the sample boards for evaluation (100) were obtained as the open failure rates and the short-circuit failure rates respectively. The evaluative criteria of the open failure rates and the short-circuit failure rates were set that, for respective failures, rate of 1% or less is evaluated to be "good (marked with circle in tables)", rate of more than 1% and 5% or less is evaluated to be "pass (marked with triangle in tables)", and rate of more than 5% is evaluated to be "bad (marked with cross in tables)".

(3) Reliability Against High Temperature and High Humidity of Sample Boards for Evaluation In the evaluation of reliability against high temperature and high humidity, an insulation condition between the terminals P1 and N1 and an insulation condition between the terminals P2 and N2 were examined after exposing individual sample board for evaluation to an environment with temperature of 85±2° C. and humidity of 80 to 90% for 500 hours, and whether the insulation resistance between the above-described terminals is 1 GΩ ($10^9$ Ω) or more or not was checked. The measurement of the insulation resistance can be performed, for example, by applying predetermined voltage between the terminals as test object and checking whether electrical current is detected or not between the terminals.

In the evaluation of the reliability against high temperature and high humidity, for each of the combinations of the base materials and conductors shown in Table 1 (Exp. 1 to Exp. 3), five pieces of sample boards for evaluation were prepared with respective to every distinct combination of the height (a), length (c) of lower base and length (d) of upper base of the trapezoidal cross-section perpendicular to the extending direction of the inplane conductors, and the interval (b) between the lower bases of the trapezoidal cross-section of the adjacent inplane conductors. After exposing these sample boards for evaluation to an environment at the above-described condition, the insulation resistances between the above-described terminals were measured. When the number of sample boards for evaluation, which presented an insulation resistance less than 1 GΩ, was zero (0) per the five sample boards, it was evaluated as "good (marked with circle in tables)"; when the number was 1 or 2 per the five sample boards, it was evaluated as "pass (marked with triangle in tables)"; and when the number was 3 or more per the five sample boards, it was evaluated as "bad (marked with cross in tables)".

(4) Evaluation Results of Various Evaluation Item

The evaluation results of open failure rates and short-circuit failure rates, and reliability against high temperature and high humidity for each of the sample boards for evaluation according to Exp. 1 to Exp. 3, obtained as described above, are listed in the following Tables 2 to 4.

TABLE 2

(Exp. 1)

| Height (a) [μm] | Interval (b) [μm] | Lower Base (c) [μm] | Upper Base (d) [μm] | a/b | d/c | Short-Circuit Failure | Open Failure | Reliability Failure Rate | Overall Evaluation |
|---|---|---|---|---|---|---|---|---|---|
| 9.0 | 15.0 | 15.0 | 14.8 | 0.60 | 0.99 | 0% | 15% | 5/5 | X |
| 9.0 | 15.0 | 15.0 | 13.8 | 0.60 | 0.92 | 1% | 9% | 5/5 | X |
| 9.0 | 15.0 | 15.0 | 13.0 | 0.60 | 0.87 | 0% | 4% | 2/5 | Δ |
| 9.0 | 15.0 | 15.0 | 12.0 | 0.60 | 0.80 | 0% | 1% | 0/5 | ○ |
| 9.0 | 15.0 | 15.0 | 10.8 | 0.60 | 0.72 | 0% | 0% | 0/5 | ○ |
| 9.0 | 15.0 | 15.0 | 9.4 | 0.60 | 0.63 | 1% | 0% | 0/5 | ○ |
| 9.0 | 15.0 | 15.0 | 8.5 | 0.60 | 0.57 | 0% | 3% | 0/5 | Δ |
| 9.0 | 15.0 | 15.0 | 7.6 | 0.60 | 0.51 | 0% | 25% | 0/5 | X |
| 7.5 | 15.0 | 15.0 | 14.8 | 0.50 | 0.99 | 1% | 11% | 5/5 | X |
| 7.5 | 15.0 | 15.0 | 13.9 | 0.50 | 0.93 | 0% | 2% | 1/5 | Δ |
| 7.5 | 15.0 | 15.0 | 12.7 | 0.50 | 0.85 | 0% | 0% | 0/5 | ○ |
| 7.5 | 15.0 | 15.0 | 11.5 | 0.50 | 0.77 | 0% | 0% | 0/5 | ○ |
| 7.5 | 15.0 | 15.0 | 10.2 | 0.50 | 0.68 | 0% | 1% | 0/5 | ○ |
| 7.5 | 15.0 | 15.0 | 9.0 | 0.50 | 0.60 | 1% | 5% | 0/5 | Δ |
| 7.5 | 15.0 | 15.0 | 7.6 | 0.50 | 0.51 | 0% | 22% | 0/5 | X |
| 6.0 | 15.0 | 15.0 | 14.7 | 0.40 | 0.98 | 0% | 3% | 1/5 | Δ |
| 6.0 | 15.0 | 15.0 | 13.5 | 0.40 | 0.90 | 0% | 0% | 0/5 | ○ |
| 6.0 | 15.0 | 15.0 | 12.3 | 0.40 | 0.82 | 0% | 0% | 0/5 | ○ |
| 6.0 | 15.0 | 15.0 | 10.9 | 0.40 | 0.73 | 0% | 1% | 0/5 | ○ |
| 6.0 | 15.0 | 15.0 | 9.5 | 0.40 | 0.63 | 0% | 5% | 0/5 | Δ |
| 6.0 | 15.0 | 15.0 | 8.5 | 0.40 | 0.57 | 1% | 6% | 0/5 | X |
| 6.0 | 15.0 | 15.0 | 7.6 | 0.40 | 0.51 | 0% | 9% | 0/5 | X |

TABLE 3

(Exp. 2)

| Height (a) [μm] | Interval (b) [μm] | Lower Base (c) [μm] | Upper Base (d) [μm] | a/b | d/c | Short-Circuit Failure | Open Failure | Reliability Failure Rate | Overall Evaluation |
|---|---|---|---|---|---|---|---|---|---|
| 6.0 | 10.0 | 10.0 | 9.9 | 0.60 | 0.99 | 1% | 30% | 5/5 | X |
| 6.0 | 10.0 | 10.0 | 9.2 | 0.60 | 0.92 | 0% | 12% | 4/5 | X |
| 6.0 | 10.0 | 10.0 | 8.7 | 0.60 | 0.87 | 1% | 3% | 1/5 | Δ |

TABLE 3-continued (Exp. 2)

| Height (a) [μm] | Interval (b) [μm] | Lower Base (c) [μm] | Upper Base (d) [μm] | a/b | d/c | Short-Circuit Failure | Open Failure | Reliability Failure Rate | Overall Evaluation |
|---|---|---|---|---|---|---|---|---|---|
| 6.0 | 10.0 | 10.0 | 8.0 | 0.60 | 0.80 | 0% | 0% | 0/5 | ○ |
| 6.0 | 10.0 | 10.0 | 7.2 | 0.60 | 0.72 | 0% | 1% | 0/5 | ○ |
| 6.0 | 10.0 | 10.0 | 6.3 | 0.60 | 0.63 | 0% | 0% | 0/5 | ○ |
| 6.0 | 10.0 | 10.0 | 5.7 | 0.60 | 0.57 | 0% | 3% | 0/5 | Δ |
| 6.0 | 10.0 | 10.0 | 5.1 | 0.60 | 0.51 | 1% | 26% | 0/5 | X |
| 5.0 | 10.0 | 10.0 | 9.9 | 0.50 | 0.99 | 0% | 21% | 4/5 | X |
| 5.0 | 10.0 | 10.0 | 9.3 | 0.50 | 0.93 | 1% | 4% | 2/5 | Δ |
| 5.0 | 10.0 | 10.0 | 8.6 | 0.50 | 0.86 | 0% | 0% | 0/5 | ○ |
| 5.0 | 10.0 | 10.0 | 7.8 | 0.50 | 0.78 | 0% | 0% | 0/5 | ○ |
| 5.0 | 10.0 | 10.0 | 6.8 | 0.50 | 0.68 | 0% | 0% | 0/5 | ○ |
| 5.0 | 10.0 | 10.0 | 6.0 | 0.50 | 0.60 | 1% | 4% | 0/5 | Δ |
| 5.0 | 10.0 | 10.0 | 5.1 | 0.50 | 0.51 | 0% | 18% | 0/5 | X |
| 4.0 | 10.0 | 10.0 | 9.8 | 0.40 | 0.98 | 0% | 4% | 2/5 | Δ |
| 4.0 | 10.0 | 10.0 | 9.0 | 0.40 | 0.90 | 0% | 0% | 0/5 | ○ |
| 4.0 | 10.0 | 10.0 | 8.2 | 0.40 | 0.82 | 0% | 0% | 0/5 | ○ |
| 4.0 | 10.0 | 10.0 | 7.3 | 0.40 | 0.73 | 0% | 1% | 0/5 | ○ |
| 4.0 | 10.0 | 10.0 | 6.3 | 0.40 | 0.63 | 1% | 3% | 0/5 | Δ |
| 4.0 | 10.0 | 10.0 | 5.7 | 0.40 | 0.57 | 0% | 8% | 0/5 | X |
| 4.0 | 10.0 | 10.0 | 5.1 | 0.40 | 0.51 | 1% | 11% | 0/5 | X |

TABLE 4

(Exp. 3)

| Height (a) [μm] | Interval (b) [μm] | Lower Base (c) [μm] | Upper Base (d) [μm] | a/b | d/c | Short-Circuit Failure | Open Failure | Reliability Failure Rate | Overall Evaluation |
|---|---|---|---|---|---|---|---|---|---|
| 3.0 | 5.0 | 5.0 | 4.9 | 0.60 | 0.99 | 0% | 25% | 5/5 | X |
| 3.0 | 5.0 | 5.0 | 4.6 | 0.60 | 0.92 | 1% | 15% | 4/5 | X |
| 3.0 | 5.0 | 5.0 | 4.3 | 0.60 | 0.87 | 0% | 4% | 1/5 | Δ |
| 3.0 | 5.0 | 5.0 | 4.0 | 0.60 | 0.80 | 0% | 0% | 0/5 | ○ |
| 3.0 | 5.0 | 5.0 | 3.6 | 0.60 | 0.72 | 0% | 0% | 0/5 | ○ |
| 3.0 | 5.0 | 5.0 | 3.1 | 0.60 | 0.63 | 0% | 0% | 0/5 | ○ |
| 3.0 | 5.0 | 5.0 | 2.8 | 0.60 | 0.57 | 1% | 4% | 0/5 | Δ |
| 3.0 | 5.0 | 5.0 | 2.5 | 0.60 | 0.51 | 0% | 24% | 0/5 | X |
| 2.5 | 5.0 | 5.0 | 4.9 | 0.50 | 0.99 | 1% | 18% | 4/5 | X |
| 2.5 | 5.0 | 5.0 | 4.6 | 0.50 | 0.93 | 1% | 4% | 2/5 | Δ |
| 2.5 | 5.0 | 5.0 | 4.2 | 0.50 | 0.85 | 0% | 0% | 0/5 | ○ |
| 2.5 | 5.0 | 5.0 | 3.8 | 0.50 | 0.77 | 0% | 0% | 0/5 | ○ |
| 2.5 | 5.0 | 5.0 | 3.4 | 0.50 | 0.68 | 0% | 1% | 0/5 | ○ |
| 2.5 | 5.0 | 5.0 | 3.0 | 0.50 | 0.60 | 0% | 4% | 0/5 | Δ |
| 2.5 | 5.0 | 5.0 | 2.5 | 0.50 | 0.51 | 0% | 20% | 0/5 | X |
| 2.0 | 5.0 | 5.0 | 4.9 | 0.40 | 0.98 | 0% | 3% | 2/5 | Δ |
| 2.0 | 5.0 | 5.0 | 4.5 | 0.40 | 0.90 | 0% | 0% | 0/5 | ○ |
| 2.0 | 5.0 | 5.0 | 4.1 | 0.40 | 0.82 | 0% | 0% | 0/5 | ○ |
| 2.0 | 5.0 | 5.0 | 3.7 | 0.40 | 0.74 | 0% | 0% | 0/5 | ○ |
| 2.0 | 5.0 | 5.0 | 3.2 | 0.40 | 0.63 | 1% | 4% | 0/5 | Δ |
| 2.0 | 5.0 | 5.0 | 2.9 | 0.40 | 0.58 | 0% | 5% | 0/5 | X |
| 2.0 | 5.0 | 5.0 | 2.5 | 0.40 | 0.51 | 1% | 13% | 0/5 | X |

As apparent from the data shown in the above-described Tables 2 to 4, in the central portion of the sample boards for evaluation according to the present experiment (corresponding to the region including the inplane conductor corresponding to the previously mentioned fine-lined inplane wiring), a highly fine-lined inner layer wiring (corresponding to the previously mentioned fine-lined inplane wiring) is disposed, wherein the width (c) of the inplane conductors extending in respective planes of the first wiring layer and the second wiring layer (the length of the lower base of the trapezoidal cross-section of inplane conductors perpendicular to the extending direction of the inplane conductor) and interval (b) between the lower bases of the trapezoidal cross-section of inplane conductors adjacent in a plane of each of the first wiring layer and the second wiring layer are respectively 15 μm or less, more preferably 10 μm or less.

As apparent from the evaluation results shown in the above-described Tables 2 to 4, even in the various sample boards for evaluation wherein the inner layer wirings highly fine-lined as described above are disposed, open failure rate and decrease in reliability against high temperature and high humidity can be remarkably decreased by configuring the height (a), the length (c) of the lower base and the length (d) of the upper base of the trapezoidal cross-section of an inplane conductor constituting such a fine-lined inplane wiring, and the interval (b) between the lower bases of the trapezoidal cross-section of the inplane conductors adjacent in a plane parallel to the principal surfaces of the board so as to meet a certain relation.

Now, referring to the graph shown in FIG. 3, the above-described evaluation results will be explained. As mentioned previously, FIG. 3 is a graph showing the relation between the combinations of the ratio (a/b) (horizontal axis) of the height (a) to the interval (b) and the ratio (d/c) (vertical axis) of the length (d) of the upper base to the length (c) of the lower base in the trapezoidal cross-section of an inplane conductor constituting a fine-lined inplane wiring, and the generation status of various failures as a circuit board. In the graph shown in FIG. 3, various generation statuses of various failures as a circuit board are represented using the sign at the plots in the graph. Specifically, the plots corresponding to sample boards for evaluation, for which an extremely good evaluation result with extremely low occurrences of various failures is represented by a circle (○), the plots corresponding to sample boards for evaluation, for which a good evaluation result with acceptable occurrences of various failures is represented by a triangle (Δ), and the plots corresponding to sample boards for evaluation, for which a bad evaluation result with occurrences of various failures exceeding an acceptable extent is represented by a cross (x).

Figure 3:
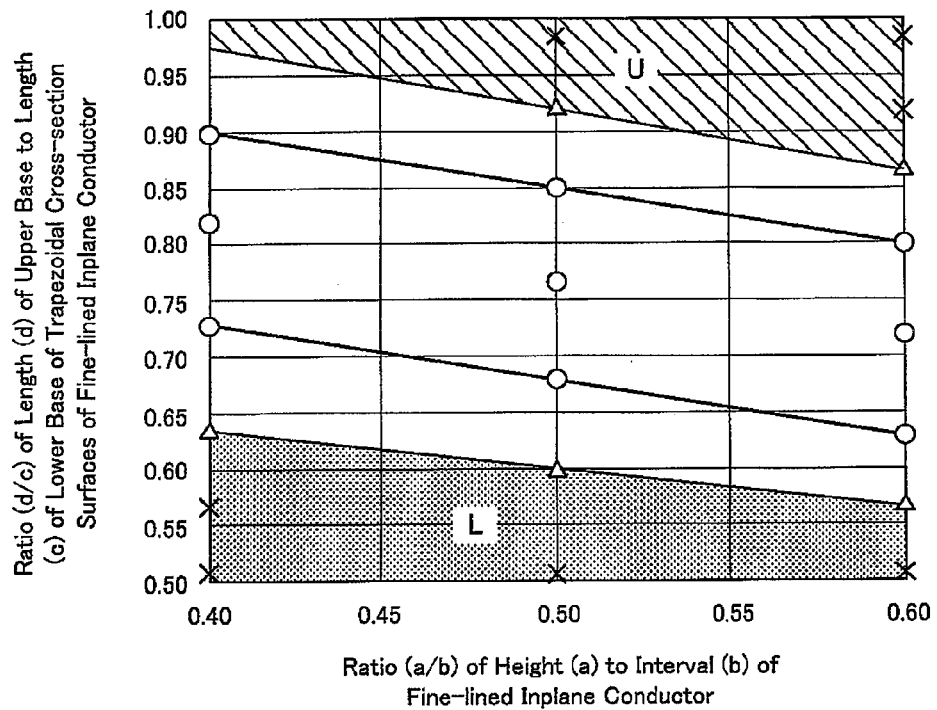
FIG. 3 is a graph showing the relation between the combinations of the ratio (a/b) of the height (a) to the interval (b) and the ratio (d/c) of the length (d) of the upper base to the length (c) of the lower base in the trapezoidal cross-section surface of an inplane conductor constituting a fine-lined inplane wiring, and the generation status of various failures as a circuit board.

As apparent from the graph shown in FIG. 3, when the ratio (d/c) of the length (d) of the upper base to the length (c) of the lower base of the trapezoidal cross-section of inplane conductors constituting the fine-lined inplane wiring is $-3/10*(a/b)+0.75$ or more, more preferably $-1/2*(a/b)+0.93$ or more, and $-11/20 (a/b)+1.20$ or less, more preferably $-1/2*(a/b)+1.10$ or less, the open failure rate and the decrease in reliability against high temperature and high humidity can be remarkably decreased.

On the other hand, when the ratio (d/c) of the length (d) of the upper base to the length (c) of the lower base of the trapezoidal cross-section of inplane conductors constituting the fine-lined inplane wiring is less than $-3/10*(a/b)+0.75$ (corresponding to the region "L" in the graph shown in FIG. 3), the open failure frequently occurred. As mentioned previously, this is considered that detachment and lack of conductor pattern occurred, for example, on manufacturing the sample boards for evaluation and led to the open failure (poor continuity).

Conversely, when the ratio (d/c) of the length (d) of the upper base to the length (c) of the lower base of the trapezoidal cross-section of inplane conductors constituting the fine-lined inplane wiring is more than $-11/20*(a/b)+1.20$ (corresponding to the region "U" in the graph shown in FIG. 3), the open failure frequently occurred. As mentioned previously, this is considered that, since it is difficult to fill the slurry into a corner portion formed by the side surfaces of the conductor patterns and the surface of the protective substrate or green sheet (especially, between adjacent conductor patterns) and a void becomes likely to occur at the portion, the fine-lined inplane wiring was disconnected, moisture penetrated into the void on exposure to high temperature and high humidity environment or the like and decreased insulation resistance after exposure to high temperature and high humidity environment (reliability against high temperature and high humidity).

From the above, in the laminated and sintered ceramic circuit boards according to the present invention including the various embodiments described in the above experimental example, even though it comprises a fine-lined wiring layer, as described above, the shape of the cross-section of the fine-lined inplane conductor is trapezoid, and the height (a), the length (c) of the lower base and the length (d) of the upper base of the trapezoidal cross-section, and the interval (b) between the lower bases of the trapezoidal cross-section surfaces of the inplane conductors adjacent in a plane parallel to the principal surfaces of the board meet a certain relation, problems such as frequent occurrences of open of wiring (disconnection) and decrease in reliability under high temperature and high humidity environment can be suppressed. Namely, the present invention can provide a laminated ceramic circuit board with low open failure rate, short-circuit failure rate and high reliability against high temperature and high humidity in spite of its fine-lined wiring layer. In addition, the present invention can provide a fast, downsized and short-in-height (thin) semiconductor package with high reliability by using such a circuit board.

Although some embodiments with certain configurations have been described for the purpose of description of the present invention, it is not necessary to say that the scope of the present invention is not limited to these exemplary embodiments and modification can be properly added within the range of the matter described in the claims and specification.

What is claimed is:

1. A laminated and sintered ceramic circuit board, comprising:
   a base material comprising a plurality of dielectric layers of a ceramic,
   a plurality of first surface electrodes, each electrode comprising a conductor exposed at a first principal surface that is one of two principal surfaces of said base material,
   a plurality of second surface electrodes, each electrode comprising a conductor exposed at a second principal surface that is another of said two principal surfaces, and
   an inner layer wiring comprising a conductor embedded within said base material;
   wherein said inner layer wiring electrically connects at least a portion of said first surface electrodes and at least a portion of said second surface electrodes,
   said inner layer wiring comprises a through conductor extending through at least one of said plurality of dielectric layers in a direction perpendicular to said principal surfaces and inplane conductors extending in a plurality of planes parallel to said principal surfaces,
   at least a portion of said inplane conductors are fine-lined inplane wiring which has a trapezoidal cross-section perpendicular to the extending direction of said portion, where an upper base and a lower base of said trapezoid are parallel to said principal surfaces, a length (c) of said lower base is 15 μm or less, said portion has an adjacent another portion of said inplane conductors in a plane parallel to said principal surfaces, said adjacent another portion has an another trapezoidal cross-section perpendicular to the extending direction of said adjacent another portion, and an interval (b) between the lower bases of the trapezoids of said portion and said adjacent another portion is 15 μm or less,
   a height (a) of the trapezoidal cross-section of the inplane conductor constituting said fine-lined inplane wiring and said interval (b) meet the relation represented by the following formula (1):

$$0.4 \leq \frac{a}{b}, \quad \frac{a}{b} \leq 0.6 \tag{1}$$

said height (a), said interval (b), said length (c) of said lower base and a length (d) of said upper base of the trapezoidal cross-section of inplane conductors constituting said fine-lined inplane wiring meet the relation represented by the following formula (2):

$$-\frac{3}{10} \times \frac{a}{b} + 0.75 \le \frac{d}{c}, \quad \frac{d}{c} \le -\frac{11}{20} \times \frac{a}{b} + 1.20. \qquad (2)$$

2. The laminated and sintered ceramic circuit board according to claim 1, wherein
said height (a), said interval (b), said length (c) of said lower base and said length (d) of said upper base of the trapezoidal cross-section of inplane conductors constituting said fine-lined inplane wiring meet the relation represented by the following formula (3):

$$-\frac{1}{2} \times \frac{a}{b} + 0.93 \le \frac{d}{c}, \quad \frac{d}{c} \le -\frac{1}{2} \times \frac{a}{b} + 1.10. \qquad (3)$$

3. The laminated and sintered ceramic circuit board according to claim 1, wherein
said lower base of the trapezoidal cross-section of inplane conductors constituting said fine-lined inplane wiring is disposed in a plane corresponding to a boundary face between a dielectric layer constituting the base material with the inplane conductors embedded therein and a dielectric layer adjacent to said dielectric layer in a direction perpendicular to said principal surfaces.

4. The laminated and sintered ceramic circuit board according to claim 1, wherein
said conductor comprises at least one metal selected from gold, silver and copper.

5. The laminated and sintered ceramic circuit board according to claim 4, wherein
said conductor comprises copper, and
said ceramic is sinterable at a temperature of less than 1080° C.

6. The laminated and sintered ceramic circuit board according to claim 4, wherein
said conductor comprises silver, and
said ceramic is sinterable at a temperature of less than 960° C.

7. A semiconductor package comprising a semiconductor element and a package board, wherein
said semiconductor element and said package board are electrically connected through an intermediate board interposed between said semiconductor element and said package board,
said intermediate board is a laminated and sintered ceramic circuit board, which comprises:
a base material comprising a plurality of dielectric layers of ceramic,
a plurality of first surface electrodes, each electrode comprising a conductor exposed at a first principal surface that is one of two principal surfaces of said base material,
a plurality of second surface electrodes, each electrode comprising a conductor exposed at a second principal surface that is another surface of said two principal surfaces, and
an inner layer wiring comprising a conductor embedded within said base material;
wherein said inner layer wiring electrically connects at least a portion of said first surface electrodes and at least a portion of said second surface electrodes,
said inner layer wiring comprises a through conductor extending through at least one of said plurality of dielectric layers in a direction perpendicular to said principal surfaces and inplane conductors extending in plural plurality of planes parallel to said principal surfaces,
at least a portion of said inplane conductors are fine-lined inplane wiring which has a trapezoidal cross-section perpendicular to the extending direction of said portion, where an upper base and a lower base of said trapezoid are parallel to said principal surfaces, a length (c) of said lower base is 15 μm or less, said portion has an adjacent another portion of said inplane conductors in plane parallel to said principal surfaces, said adjacent another portion has an another trapezoidal cross-section perpendicular to the extending direction of said adjacent another portion, and an interval (b) between the lower bases of the trapezoids of said portion and said adjacent another portion is 15 μm or less,
a height (a) of the trapezoidal cross-section of the inplane conductor constituting said fine-lined inplane wiring and said interval (b) meet the relation represented by the following formula (1):

$$0.4 \le \frac{a}{b}, \quad \frac{a}{b} \le 0.6 \qquad (1)$$

said height (a), said interval (b), said length (c) of said lower base and a length (d) of said upper base of the trapezoidal cross-section of inplane conductors constituting said fine-lined inplane wiring meet the relation represented by the following formula (2):

$$-\frac{3}{10} \times \frac{a}{b} + 0.75 \le \frac{d}{c}, \quad \frac{d}{c} \le -\frac{11}{20} \times \frac{a}{b} + 1.20. \qquad (2)$$

8. The semiconductor package according to claim 7, wherein
said height (a), said interval (b), said length (c) of said lower base and said length (d) of said upper base of the trapezoidal cross-section of inplane conductors constituting said fine-lined inplane wiring meet the relation represented by the following formula (3):

$$-\frac{1}{2} \times \frac{a}{b} + 0.93 \le \frac{d}{c}, \quad \frac{d}{c} \le -\frac{1}{2} \times \frac{a}{b} + 1.10. \qquad (3)$$

9. The semiconductor package according to claim 7, wherein
said lower base of the trapezoidal cross-section of inplane conductors constituting said fine-lined inplane wiring is disposed in a plane corresponding to a boundary face between a dielectric layer constituting the base material with the inplane conductors embedded therein and a dielectric layer adjacent to said dielectric layer in a direction perpendicular to said principal surfaces.

10. The semiconductor package according to claim 7, wherein said semiconductor element is a semiconductor IC chip.

11. The semiconductor package according to claim 7, wherein the base material of said package board comprises a resin.

12. The semiconductor package according to claim 7, wherein said conductor comprises at least one metal selected from gold, silver and copper.

13. The semiconductor package according to claim 12, wherein said conductor comprises copper, and said ceramic is sinterable at a temperature of less than 1080° C.

14. The semiconductor package according to claim 12, wherein said conductor comprises silver, and said ceramic is sinterable at a temperature of less than 960° C.

* * * * *